(12) United States Patent
Speechley

(10) Patent No.: US 10,763,436 B2
(45) Date of Patent: Sep. 1, 2020

(54) SEMICONDUCTOR PATTERNING

(71) Applicant: FLEXENABLE LIMITED, Cambridge (GB)

(72) Inventor: Elizabeth Speechley, Cambridge (GB)

(73) Assignee: FLEXENABLE LIMITED, Cambridge (GB)

( * ) Notice: Subject to any disclaimer, the term of this patent is extended or adjusted under 35 U.S.C. 154(b) by 0 days.

(21) Appl. No.: 16/074,450

(22) PCT Filed: Feb. 9, 2017

(86) PCT No.: PCT/EP2017/052917
§ 371 (c)(1),
(2) Date: Aug. 1, 2018

(87) PCT Pub. No.: WO2017/137511
PCT Pub. Date: Aug. 17, 2017

(65) Prior Publication Data
US 2019/0013472 A1 Jan. 10, 2019

(30) Foreign Application Priority Data
Feb. 10, 2016 (GB) .................................. 1602355.8

(51) Int. Cl.
*H01L 51/00* (2006.01)
*H01L 51/05* (2006.01)

(52) U.S. Cl.
CPC ...... *H01L 51/0023* (2013.01); *H01L 51/0018* (2013.01); *H01L 51/0019* (2013.01); *H01L 51/0558* (2013.01)

(58) Field of Classification Search
CPC ............. H01L 51/0018; H01L 51/0019; H01L 51/0558; H01L 51/0023

USPC .......................................................... 438/618
See application file for complete search history.

(56) References Cited

U.S. PATENT DOCUMENTS

| 6,407,363 | B2* | 6/2002 | Dunsky | B23K 26/02 |
| | | | | 219/121.71 |
| 7,897,468 | B1* | 3/2011 | Luo | H01L 29/1083 |
| | | | | 257/E21.421 |
| 9,209,305 | B1* | 12/2015 | Zhang | H01L 29/41733 |
| 2002/0008261 | A1* | 1/2002 | Nishiyama | H01L 21/28562 |
| | | | | 257/288 |

(Continued)

FOREIGN PATENT DOCUMENTS

EP 1 764 831 A2 3/2007

OTHER PUBLICATIONS

Written Opinion for PCT/EP2017/052917, dated May 19, 2017.
International Search Report for PCT/EP2017/052917, dated May 19, 2017.

*Primary Examiner* — Sheikh Maruf
(74) *Attorney, Agent, or Firm* — Sughrue Mion, PLLC

(57) ABSTRACT

A technique, comprising: forming a stack comprising a semiconductor layer for providing the semiconductor channels of one or more transistors, and an insulator layer; and patterning the stack so as to form in a single process both: (i) one or more interconnection holes for connecting a conductor level on one side of the stack to a conductor level on the opposite side of the stack; and (ii) one or more leakage reduction trenches for reducing leakage paths via the semiconductor between conductor elements on one side of the stack.

9 Claims, 2 Drawing Sheets

(56) References Cited

U.S. PATENT DOCUMENTS

Figure 1A:
Figure 1B:
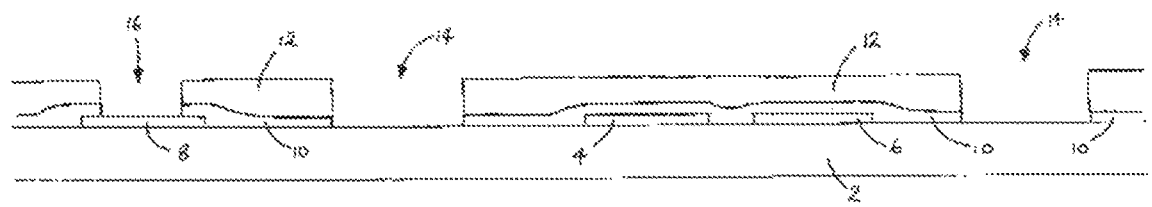
Figure 1C:
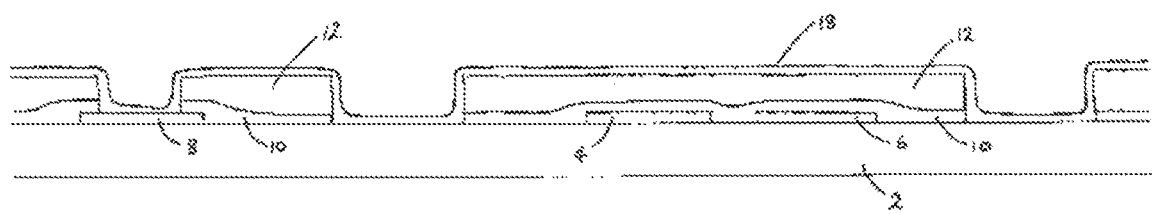
Figure 1D:
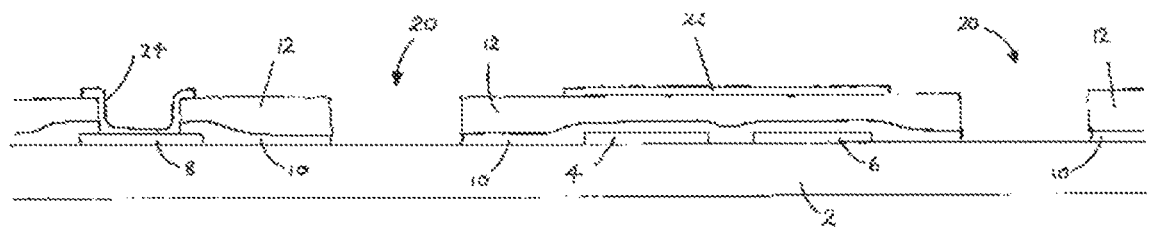
Figure 1E:
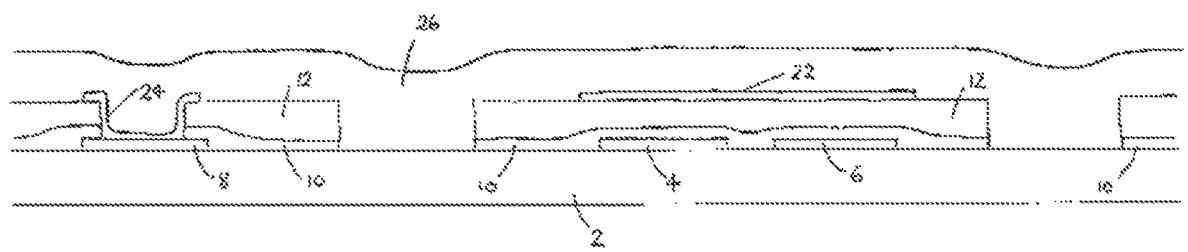

| | | | | |
|---|---|---|---|---|
| 2003/0152756 A1* | 8/2003 | Yamada | B23K 26/18 | 428/210 |
| 2005/0211976 A1* | 9/2005 | Redecker | H01L 51/0545 | 257/40 |
| 2006/0038299 A1* | 2/2006 | Hirakata | B82Y 30/00 | 257/773 |
| 2006/0160276 A1* | 7/2006 | Brown | B82Y 10/00 | 438/149 |
| 2007/0092637 A1* | 4/2007 | Brown | H01L 21/268 | 427/97.7 |
| 2007/0254402 A1* | 11/2007 | Dimmler | H01L 51/0022 | 438/99 |
| 2008/0220562 A1* | 9/2008 | Dimmler | H01L 51/052 | 438/99 |
| 2010/0065926 A1* | 3/2010 | Yeh | H01L 21/28105 | 257/410 |
| 2010/0301327 A1* | 12/2010 | Kang | G02F 1/1333 | 257/43 |
| 2010/0320459 A1* | 12/2010 | Umeda | H01L 21/02554 | 257/43 |
| 2011/0095333 A1* | 4/2011 | Park | H01L 29/66325 | 257/139 |
| 2011/0215328 A1* | 9/2011 | Morosawa | H01L 29/786 | 257/59 |
| 2012/0061664 A1* | 3/2012 | Yamazaki | H01L 27/1225 | 257/43 |
| 2012/0061665 A1* | 3/2012 | Miyake | H01L 27/1225 | 257/43 |
| 2012/0062813 A1* | 3/2012 | Koyama | G02F 1/136213 | 349/43 |
| 2012/0064650 A1* | 3/2012 | Yamazaki | H01L 27/1225 | 438/30 |
| 2012/0168754 A1* | 7/2012 | Le Neel | H01L 29/66742 | 257/57 |
| 2012/0218485 A1* | 8/2012 | Chikama | G02F 1/136213 | 349/39 |
| 2013/0026570 A1* | 1/2013 | Fan | H01L 21/84 | 257/347 |
| 2014/0264525 A1* | 9/2014 | Takahashi | H01L 27/11563 | 257/314 |
| 2014/0273373 A1* | 9/2014 | Makala | H01L 21/8221 | 438/270 |
| 2015/0294978 A1* | 10/2015 | Lu | H01L 21/31144 | 438/269 |
| 2015/0380558 A1* | 12/2015 | Huang | H01L 29/66795 | 257/288 |
| 2016/0204117 A1* | 7/2016 | Liu | H01L 27/11551 | 257/324 |
| 2016/0247732 A1* | 8/2016 | Zimmermann | H01L 27/283 | |
| 2017/0117187 A1* | 4/2017 | Ando | H01L 21/84 | |

* cited by examiner

SEMICONDUCTOR PATTERNING

This Application is a National Stage of International Application No. PCT/EP2017/052917 filed Feb. 9, 2017, claiming priority based on United Kingdom Patent Application No. 1602533.8 filed Feb. 10, 2016.

A semiconductor device comprising semiconductor material in selected regions may be produced by depositing semiconductor material over a relatively wide area and then removing the semiconductor material to form islands of semiconductor material in the selected regions, and immediately depositing insulator material in the regions from which the semiconductor was removed, before continuing with further processing steps.

The inventors for the present application have found that this conventional technique can be detrimental to the performance of some semiconductor devices; and the inventors for the present application have identified the challenge of providing a better technique of patterning the semiconductor in a semiconductor device.

According to the present invention, there is provided a method, comprising: forming a stack comprising a semiconductor layer for providing the semiconductor channels of one or more transistors, and an insulator layer; and patterning the stack so as to form in a single process both: (i) one or more interconnection holes for connecting a conductor level on one side of the stack to a conductor level on the opposite side of the stack; and (ii) one or more leakage reduction trenches for reducing leakage paths via the semiconductor between conductor elements on one side of the stack.

According to the present invention, there is provided a method, comprising: forming a stack comprising a semiconductor layer for providing the semiconductor channels of one or more transistors, and an insulator layer; and patterning the stack so as to form in a single process both: (i) one or more interconnection holes for connecting a conductor level on one side of the stack to a conductor level on the opposite side of the stack; and (ii) one or more leakage reduction holes for reducing leakage paths via the semiconductor between conductor elements on one side of the stack.

According to one embodiment, the one or more interconnection holes and the one or more leakage reduction trenches/holes have different length-width aspect ratios.

According to one embodiment, the one or more leakage reduction trenches/holes have a greater length-width aspect ratio than the one or more interconnection holes.

According to one embodiment, the method comprises depositing conductor material over the patterned stack, and patterning the conductor material so as to remove the conductor material in the regions of the one or more leakage reduction trenches/holes, without removing the conductor material in the region of the one or more interconnection holes.

According to one embodiment, the method comprises: selectively depositing conductor material in at least regions of the one or more interconnection holes without depositing conductor material in the regions of the one or more leakage reduction trenches/holes.

According to one embodiment, the method comprises forming the stack over a patterned conductor layer, and selectively forming the one or more leakage reduction trenches/holes only in regions unoccupied by the patterned conductor layer below the stack.

According to one embodiment, the patterned conductor layer defines at least source and drain conductors for one or more transistors, and routing conductors or one or more gate conductors of the one or more transistors; and the interconnection holes are for electrically connecting the one or more gate conductors over the stack to the routing conductors.

According to one embodiment, the method comprises depositing conductor material over the patterned stack, and patterning the conductor material so as to (a) define the one or more gate conductors, and (b) remove the conductor material in the regions of the leakage reduction trenches/holes outside the regions of the one or more gate conductors.

According to one embodiment, patterning the stack involves removing the stack in a plurality of regions, and wherein the combined total area of all regions in which the stack is removed in said patterning is less than 50% of the total upper surface area of the stack, preferably less than 10% of the total upper surface area of the stack, and more preferably less than 1% of the total upper surface area of the stack.

According to one embodiment, the leakage reduction trenches/holes function solely to reduce leakage paths via the semiconductor between conductor elements on one side of the stack.

Figure 2:
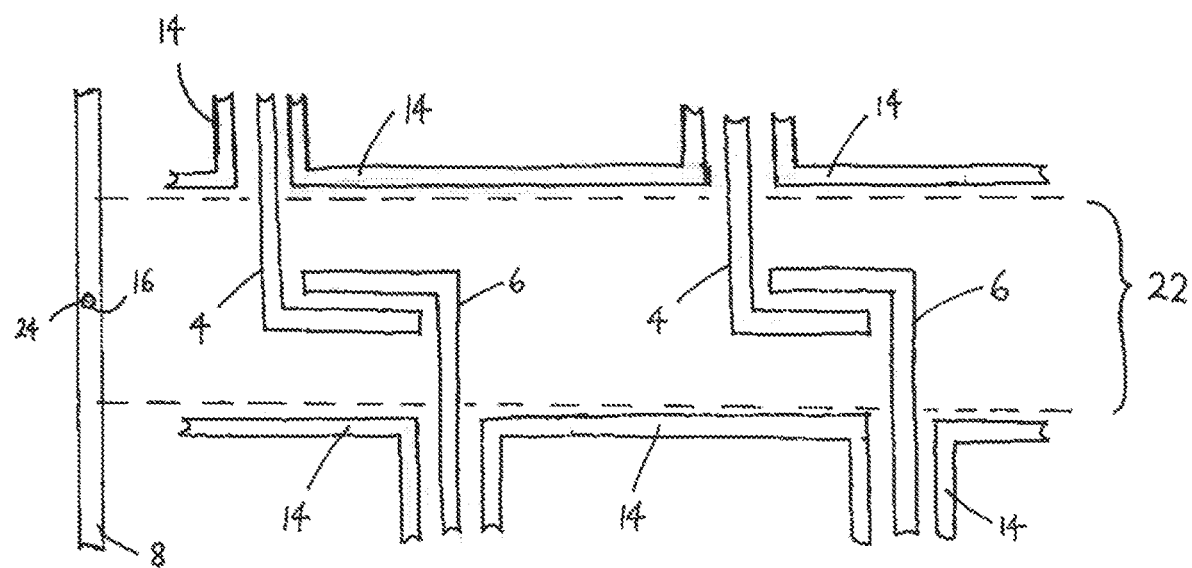
Figure 3:
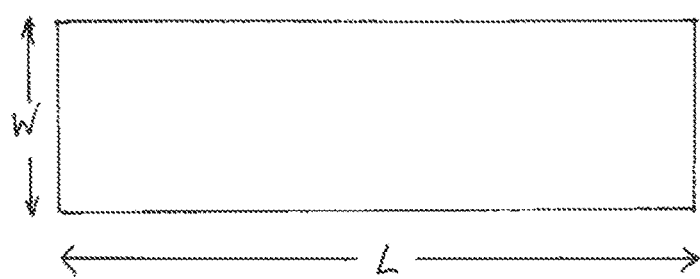

An example embodiment of the invention is described below in detail, by way of example only, with reference to the accompanying drawings, in which:

FIGS. 1(a) to 1(e) and FIG. 2 together illustrate one example of a technique of patterning a semiconductor as part of the production of a semiconductor device according to an embodiment of the present invention; and FIG. 3 illustrates the length-width aspect ratio for a hole.

FIGS. 1(a) to 1(e) do not show cross-sections through any specific part of the planar view of FIG. 2, but illustrate the sequence of steps by which the product of FIG. 2 is achieved according to an example embodiment of the present invention.

A flexible support film 2 (which may comprise a plastic base film coated with one or more layers including e.g. a planarisation layer) supports a thin patterned conductor layer (e.g. thin metal layer) defining at least (a) source and drain conductors 4, 6 for a plurality of thin film transistor (TFT) devices, and (b) one or more routing conductors 8 for routing e.g. one or more gate conductors at a higher level, as discussed below. The thin patterned conductor layer may be formed, for example, by depositing a thin continuous layer of the conductor material by e.g. a vapour deposition technique such as sputtering, and then patterning the continuous layer by e.g. photolithography and wet etching.

A thin layer of e.g. organic polymer semiconductor material 8 is then deposited over the patterned conductor layer by e.g. a liquid processing technique such as slit-coating or spin-coating. Alternatively, a vapour deposition technique such as chemical vapour deposition or sputtering may be used to deposit a thin layer of semiconductor material. A thin layer of e.g. organic polymer gate dielectric (insulator) material 10 (such as e.g. parylene) is then deposited over the thin film of semiconductor material, by e.g. a vapour deposition technique such as chemical vapour deposition or sputtering, or a liquid processing technique such as slit-coating or spin-coating.

A layer of photoresist material (not shown) is then deposited over the stack of semiconductor and gate dielectric layers, and patterned by irradiation and developing steps to form a patterned mask for patterning the stack by a dry etching technique such as e.g. reactive-ion etching (RIE) or inductively-coupled plasma reactive ion etching (ICP-RIE). The stack is etched in a single etching step using a single photoresist mask to form both (i) interconnection via holes 16 for forming electrical interlayer connections between conductor elements formed over the stack and conductor elements (e.g. routing conductors 8) below the stack, and (ii) leakage reduction holes 14 for reducing leakage currents via the semiconductor layer 10 between conductor elements in the thin patterned conductor layer below the semiconductor layer 10. As shown in FIG. 2, the leakage-reduction holes 14 may have a very different shape to that of the interconnection via holes 16. For example, the leakage-reduction holes 14 may take the form of longitudinal trenches, whereas the interconnection via holes 16 may have a substantially circular or square shape. The leakage-reduction holes 14 have a greater length-width aspect ratio than the interconnection holes. With reference to FIG. 3, the length-width aspect ratio (L/W) of a hole is defined by the ratio of the longest dimension L of the hole (e.g. length of a substantially rectangular trench) to the dimension W of the hole in a direction perpendicular to the longest dimension (e.g. the width of a substantially rectangular trench).

As shown in the figures, the leakage-reduction holes 14 are deliberately located in regions where there is no patterned conductor directly below the stack. No leakage reduction holes 14 are formed in the regions of the source and drain conductors 4, 6. This is to ensure that the process of etching the stack does not result in removal of important conductor material below the stack, and cause e.g. breaks in the source/drain conductors 4, 6 or routing conductors.

The patterning of the stack does not involve removing all the stack other than in the areas of semiconductor channels of the transistors. The patterning of the stack involves removing the stack in a small percentage of the total area of the stack. In one embodiment, the total area of the regions in which the stack is removed by the patterning is less than 50% of the total area of the upper surface of the stack; in another embodiment, total area of the regions in which the stack is removed is less than 10% of the total area of the upper surface of the stack; and in another embodiment, the total area of the regions in which the stack is removed is less than 1% of the total area of the upper surface of the stack.

The sole function of the leakage reduction holes 14 in the semiconductor device is to reduce leakage currents via the semiconductor layer 10 between conductor elements in the thin patterned conductor layer below the semiconductor layer 10, and their shape and position are tailored to this single function. The leakage reduction holes 14 do not have any other extra function in the product device; for example, the leakage reduction holes do not form pixel openings.

Next, a continuous layer of conductor material 18 (e.g. metal) is deposited over the patterned stack (by e.g. a vapour deposition technique such as sputtering) including in the regions of the interconnection via holes 16 and the leakage-reduction holes 14; and is then patterned by e.g. photolithography and wet etching to (i) define one or more gate conductors (gate lines) 22 connected to the routing conductors 8 by conductor material 24 in the region of the interconnection via-holes 16, and (ii) remove the conductor material in regions 20 including the leakage-reduction holes 14.

A continuous layer of electrically insulating material such as e.g. the Bisphenol A Novolac epoxy material known as SU-8 is then deposited over the whole area including in the regions of the leakage-reduction holes 14 and in the regions of the interconnection via holes 16, to form isolation passivation layer 26.

In FIG. 2, the dashed lines show the edges of the gate conductor 22.

In the technique described above, no leakage-reduction holes 14 are formed in regions to be occupied by the gate conductor 22. However, the leakage-reduction holes 14 may also extend into or across regions to be occupied by the gate conductor 22.

According to one variation of the above-described example technique, conductor material 18 is not deposited in the regions of the leakage-reduction holes 14. A shadow mask may be used to mask these regions and limit the deposition of conductor material 18 by a line-of-sight technique (such as sputtering) to the regions in which the gate conductor 22 and other conductor elements over the stack are to be formed. According to another variation, a printing technique such as ink-jet printing is used to selectively deposit a conductor material (or precursor to a conductor material) in selected regions to form the gate lines 22 and interlayer connects 24 without depositing conductor material (or a precursor thereto) in the regions of the leakage-reduction holes 14.

According to one variation, the stack (comprising the semiconductor layer and the gate insulating layer) is patterned by laser ablation using a laser mask (instead of by photolithography and etching using a photoresist mask on the surface of the stack).

The above-described technique has been found to significantly improve the performance of transistors, particularly for some applications such as operational amplifiers (op-amps), defined by the source-drain conductors 4, 6, the channels of semiconductor 10 between the source-drain conductors, the gate conductor 22 and the gate dielectric 12 between the semiconductor channels and the gate conductor 22. In more detail, this technique has made it possible to improve the On current of the transistors, i.e. the current that can be achieved through the transistor for a given voltage difference between the source and drain conductors and a given "On" voltage at the gate conductor.

The description above is for the example of patterning a stack for one or more top-gate transistors, but the same technique is also applicable to patterning a stack for one or more bottom-gate transistors.

Embodiments of the present invention may involve additional elements/components beyond those explicitly mentioned above. For example, self-assembled monolayers (SAMs) of e.g. organic material may be provided on the source-drain conductors in regions adjacent to the semiconductor channel(s) of the transistor(s) to better facilitate charge injection into the semiconductor channel(s).

In addition to any modifications explicitly mentioned above, it will be evident to a person skilled in the art that various other modifications of the described embodiments may be made within the scope of the invention.

The invention claimed is:

1. A method, comprising:
   forming a stack comprising a semiconductor layer for providing the semiconductor channels of one or more transistors, and an insulator layer;
   patterning the stack so as to form in a single process both:
   (i) one or more interconnection holes for connecting a conductor level on one side of the stack to a conductor level on the opposite side of the stack; and
   (ii) one or more leakage reduction trenches for reducing leakage paths via the semiconductor between conductor elements on one side of the stack; and
   depositing conductor material over the patterned stack, and patterning the conductor material so as to remove the conductor material from the whole of the regions of the one or more leakage reduction trenches, without removing the conductor material in the region of the one or more interconnection holes.

2. The method, according to claim 1, wherein the one or more interconnection holes and the one or more leakage reduction trenches have different length-width aspect ratios.

3. The method according to claim 2, wherein the one or more leakage reduction trenches have a greater length-width aspect ratio than the one or more interconnection holes.

4. The method according to claim 1, comprising forming the stack over a patterned conductor layer, and selectively forming the one or more leakage reduction trenches only in regions unoccupied by the patterned conductor layer below the stack.

5. The method according to claim 4, wherein the patterned conductor layer defines at least source and drain conductors for one or more transistors, and routing conductors or one or more gate conductors of the one or more transistors; and the interconnection holes are for electrically connecting the one or more gate conductors over the stack to the routing conductors.

6. The method according to claim 5, comprising depositing conductor material over the patterned stack, and patterning the conductor material so as to (a) define the one or more gate conductors, and (b) remove the conductor material in the regions of the leakage reduction trenches outside the regions of the one or more gate conductors.

7. The method according to claim 1, wherein patterning the stack involves removing the stack in a plurality of regions, and wherein the combined total area of all regions in which the stack is removed by said patterning is less than 10% of the total upper surface area of the stack.

8. The method according to claim 1, wherein the one or more transistors form at least part of one or more operational amplifiers.

9. The method according to claim 1, wherein the leakage reduction trenches function solely to reduce leakage paths via the semiconductor between conductor elements on one side of the stack.

* * * * *